(12) United States Patent
Tangudu et al.

(10) Patent No.: US 11,509,291 B2
(45) Date of Patent: Nov. 22, 2022

(54) DIGITAL FILTERING FOR A SIGNAL WITH TARGET AND SECONDARY SIGNAL BANDS

(71) Applicant: TEXAS INSTRUMENTS INCORPORATED, Dallas, TX (US)

(72) Inventors: Jawaharlal Tangudu, Bangalore (IN); Jaiganesh Balakrishnan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 158 days.

(21) Appl. No.: 16/351,357

(22) Filed: Mar. 12, 2019

(65) Prior Publication Data

US 2019/0280675 A1 Sep. 12, 2019

(30) Foreign Application Priority Data

Mar. 12, 2018 (IN) .............................. 201841009012

(51) Int. Cl.
| | |
|---|---|
| *H03H 17/06* | (2006.01) |
| *H03H 15/00* | (2006.01) |
| *H03H 17/02* | (2006.01) |

(52) U.S. Cl.
CPC ............ *H03H 17/06* (2013.01); *H03H 15/00* (2013.01); *H03H 17/0248* (2013.01)

(58) Field of Classification Search
CPC .... H03H 17/06; H03H 17/0248; H03H 15/00; H03H 2015/002; H03H 2015/007
See application file for complete search history.

(56) References Cited

U.S. PATENT DOCUMENTS

| | | | | |
|---|---|---|---|---|
| 5,262,974 A | * | 11/1993 | Hausman | G06F 7/4824 708/493 |
| 6,061,410 A | * | 5/2000 | Linz | H04L 25/05 341/123 |
| 7,856,048 B1 | * | 12/2010 | Smaini | H04B 1/40 375/221 |
| 9,276,798 B2 | * | 3/2016 | Yu | H04L 27/364 |

(Continued)

OTHER PUBLICATIONS

Sivannarayana, N. and K. Veerabhadra Rao. "I-Q imbalance correction in time and frequency domains with application to pulse doppler radar." Sadhana 23 (1998): 93-102. (Year: 1998).*

*Primary Examiner* — Matthew D Sandifer
*Assistant Examiner* — Huy Duong
(74) *Attorney, Agent, or Firm* — John R. Pessetto; Charles A. Brill; Frank D. Cimino

(57) ABSTRACT

A zero-insertion FIR filter architecture for filtering a signal with a target band and a secondary band. Digital filter circuitry includes an L-tap FIR (finite impulse response) filter, with a number L filter tap elements (L=0, 1, 2, . . . (L−1)), each with an assigned coefficient from a defined coefficient sequence. The L-tap FIR filter is configurable with a defined zero-insertion coefficient sequence of a repeating sub-sequence of a nonzero coefficient followed by one or more zero-inserted coefficients, with a number Nj of nonzero coefficients, and a number Nk of zero-inserted coefficients, so that L=Nj+Nk. The L-tap FIR filter is configurable as an M-tap FIR filter with a nonzero coefficient sequence in which each of the L filter tap elements is assigned a non-zero coefficient, the M-tap FIR filter having an effective length of M=(Nj+Nk) non-zero coefficients.

17 Claims, 9 Drawing Sheets

(56) References Cited

U.S. PATENT DOCUMENTS

| | | | |
|---|---|---|---|
| 2002/0049798 A1* | 4/2002 | Wang | H03H 17/06 |
| | | | 708/319 |
| 2010/0241681 A1* | 9/2010 | Kim | H03H 17/06 |
| | | | 708/319 |
| 2011/0069767 A1* | 3/2011 | Zhu | H04L 27/3863 |
| | | | 375/259 |
| 2012/0115412 A1* | 5/2012 | Gainey | H04L 5/0007 |
| | | | 455/7 |

* cited by examiner

DIGITAL FILTERING FOR A SIGNAL WITH TARGET AND SECONDARY SIGNAL BANDS

CROSS-REFERENCE TO RELATED APPLICATIONS

Priority is claimed under 37 CFR 1.78 and 35 USC 119(e) to INDIA Provisional Application 2018/41009012 (Docket TI-78454PS), filed 2018 Mar. 12, which is incorporated by reference in its entirety.

BACKGROUND

Wireless infrastructure can employ zero intermediate frequency (zero IF) architectures for TX and RX. A zero If architecture includes an analog signal chain providing RF TX/RX, and a digital signal chain operating at baseband with DUC/DDC (digital upconversion/downconversion), the analog chain including complex. The analog and digital signal chains are interfaced with a TX DAC or RX ADC.

TX/RX uses quadrature modulation in I and Q signal paths. The analog signal chain includes a complex IQ modulator (TX), or demodulator (RX). Mismatches between the I and Q signal chains (IQ errors) include gain errors in the mixers and other analog circuits, phase errors in the local oscillator signals, mismatch errors in the filter transfer functions, and delay errors through the I and Q signal paths. These I/Q mismatch errors lead to side-band leakage (I/Q imbalance). These errors can be frequency dependent.

The TX digital signal chain commonly includes DPD (digital pre-distortion) to compensate for nonlinearities in the RF power amplifier. As a result, the transmit chain bandwidth is larger than the target bandwidth through the analog signal chain because of DPD bandwidth expansion (for PA nonlinearity reduction).

TX/RX IQ mismatch in the analog chain can be corrected in the digital chain with digital TX/RX IQmc (IQ mismatch correction): at the TX end, in the TX chain, the digital TX IQmc corrector essentially pre-distorts the baseband signal to compensate for IQ mismatch in the downstream analog IQ modulator; at the RX end, in the RX chain, the digital RX IQmc corrector corrects for IQ mismatch in the upstream analog IQ demodulator.

Common TX/RX IQmc corrector architectures use multi-tap FIR filters to correct for the frequency dependent IQ mismatch errors. The multi-tap FIR filter is constructed with a specified length L of filter taps, with selectively assigned (estimated) coefficients, and associated MAC (multiply-accumulate) Z delay elements. Increasing FIR filter length, such as to accommodate DPD bandwidth expansion, requires an attendant increase in size and power.

While this Background information references wireless, radio frequency, zero intermediate frequency signal processing, and IQ mismatch correction, this Patent Disclosure is more generally directed to digital filtering for signals with target and secondary bandwidth.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for digitally filtering a signal with a target band and a secondary band. An example application for a zero-insertion FIR filter architecture to implement an IQmc mismatch corrector (TX or RX).

According to aspects of the Disclosure, the zero-insertion FIR architecture includes an L-tap FIR (finite impulse response) filter, with a number L filter tap elements (L=0, 1, 2, . . . (L−1)), each with an assigned coefficient from a defined coefficient sequence. The L-tap FIR filter is configurable with a defined zero-insertion coefficient sequence of a repeating sub-sequence of a nonzero coefficient followed by one or more zero-inserted coefficients, with a number Nj of non-zero coefficients, and a number Nk of zero-inserted coefficients, so that L=Nj+Nk. The L-tap FIR filter is configurable as an M-tap FIR filter with a non-zero coefficient sequence in which each of the L filter tap elements is assigned non-zero coefficient, the M-tap FIR filter having an effective length of M=Nj+Nk nonzero coefficients.

According to other aspects of the Disclosure, the zero-insertion FIR architecture is used in a system for radio frequency (RF) communication of an RF signal including a target frequency band, the system including a transmit (TX) end, and receive (RX) end, the circuit. At one of the TX end and the RX end, an analog signal chain operates on an analog signal based on the signal, and the digital signal chain to operate on a digital signal based on the signal. The analog signal chain includes analog circuitry that introduces analog signal impairments to the analog signal within the target band and the secondary band, the signal impairments being frequency dependent. The digital signal chain includes corrector circuitry to filter the digital signal to correct the analog signal impairments, and to generate a filtered digital signal. The corrector circuitry can include an L-tap FIR (finite impulse response) filter, with a number L filter tap elements (L=0, 1, 2, . . . (L−1)), each with an assigned coefficient from a defined coefficient sequence. The L-tap FIR filter configurable with a defined zero-insertion coefficient sequence of a repeating sub-sequence of a nonzero coefficient followed by one or more zero-inserted coefficients, with a number Nj of nonzero coefficients, and a number Nk of zero-inserted coefficients, so that L=Nj+Nk. The L-tap FIR filter configurable as an M-tap FIR filter with a nonzero coefficient sequence in which each of the L filter tap elements is assigned a non-zero coefficient, the M-tap FIR filter having an effective length of M=Nj+Nk nonzero coefficients.

According to other aspects of the Disclosure, a method of digital filtering a signal with a target band and a secondary band, includes: (a) configuring an L-tap FIR (finite impulse response) filter, with a number L filter tap elements (L=0, 1, 2, . . . (L−1)), each with an assigned coefficient from a defined coefficient sequence; (b) configuring the L-tap FIR filter with a defined zero-insertion coefficient sequence of a repeating sub-sequence of a nonzero coefficient followed by one or more zero-inserted coefficients, with a number Nj of nonzero coefficients, and a number Nk of zero-inserted coefficients, so that L=Nj+Nk; and (c) configuring the L-tap FIR filter as an M-tap FIR filter with a nonzero coefficient sequence in which each of the L filter tap elements is assigned non-zero coefficient, the M-tap FIR filter having an effective length of M=Nj+Nk nonzero coefficients.

Other aspects and features of the invention claimed in this Patent Document will be apparent to those skilled in the art from the following Disclosure.

BRIEF DESCRIPTION OF THE DRAWINGS

FIG. 3A illustrates a signal band with DPD bandwidth expansion, the resulting signal bandwidth including the center (target) band, and DPD expansion (secondary) bands with lower signal power, and including a superimposed IQ mismatch image signals; and FIG. 3B illustrates a right side, strong signal (target) band, and a left side, lower-power weak signal (secondary) band, both with IQ mismatch image signals.

FIG. 4A illustrates a normal mode L-tap FIR filter 431 with normal coefficient sequence [h0, h1, h2 ... h(L−1)]; and FIG. 4B illustrates a zero-insertion mode L-tap FIR filter 531 with an example zero-insertion coefficient sequence with zero-inserted odd coefficients [h0, 0, h2, 0, h4, 0 ... h(L−2), 0], which can be reconfigured as a zero-insertion M-tap FIR filter with zero-inserted coefficients reassigned with nonzero coefficients, effectively extending the length of the L-tap FIR to optimize for to pre/post-correcting signal impairments.

FIG. 5A illustrates an example RF TX zero IF architecture with a digital chain 110, analog chain 120, and power amplifier 130, the digital chain including a TX IQmc Corrector 300TX with a zero-insertion FIR filter 310TX to pre-compensate for downstream analog IQ mismatch errors introduced by an analog IQ modulator 124; and FIG. 5B illustrates an example RF RX zero IF architecture with an LNA receiver 210, analog chain 220, and digital chain 230, the digital chain including an RX IQmc Corrector 300RX with a zero-insertion FIR filter 310RX to correct for upstream analog IQ mismatch errors introduced by an analog IQ demodulator 224.

FIG. 6A illustrates an example abstracted FIR filter architecture 620, configurable in both normal and zero-insertion modes, including parallel x(2n) and x(2n+1) filters, each with filter sections EVEN [h0, h2, ... h14] and ODD [h1, h3, ... h15], each filter configurable for normal mode with L taps, or zero-insertion mode with M=2 L taps, the EVEN section including L/2 EVEN coefficients [h0, h2, ... h14], and the ODD section including L/2 coefficients, which, in normal mode, can be assigned as ODD coefficients [h1, h3, ... h15], or, in zero-insertion mode, can be assigned as EVEN coefficients [h16, h18, ... h30], effectively extending the FIR length to M=2 L; and FIG. 6B illustrates the example 2× parallelization FIR filter structure in transpose form.

DETAILED DESCRIPTION

Figure 1:
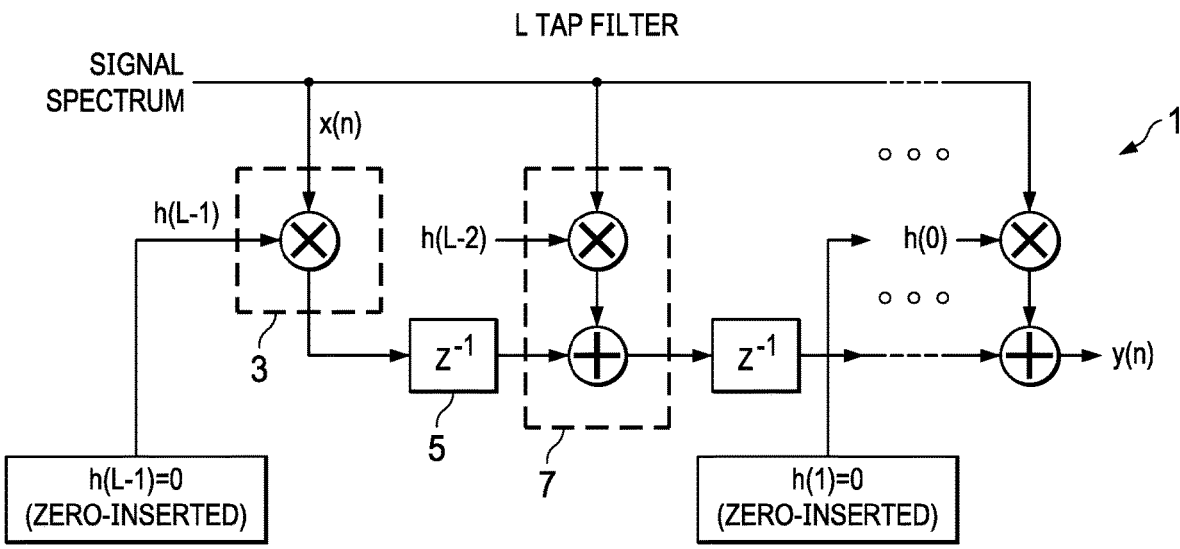
FIG. 1 illustrates an example zero-insertion FIR filter architecture 1, in transpose form, for filtering a signal with target and secondary signal bands, with an L-tap FIR filter of length L taps represented by L coefficient multiplier elements [h(L)*x(n)], and with a coefficient sequence [h(0), h(1), ... h(L−1)], with (L−1), and with an example zero-insertion for the odd coefficients [h(2 L+1)=0] according to the Disclosure.

This Description and the Drawings constitute a Disclosure, including design examples and implementations, and including illustrating various technical features and advantages for: a zero-insertion FIR filter architecture, for filtering a signal with target and secondary signal bands, based on a defined coefficient sequence with non-zero and zero-inserted coefficients, and with all FIR taps assigned only non-zero coefficients, effectively extending the length of the FIR filter by the number of zero-inserted coefficients reassigned as non-zero coefficients, optimizing the FIR for filtering in the target band.

This Disclosure uses the following nomenclature. An L-tap FIR filter of length L taps is represented by L coefficient multiplier elements h(L)*x(n), with a coefficient sequence h(0), h(1), ... h(L−1), and with FIR filter input x(n) and output y(n) related by: [y(n)=h(0)*x(n)+h(1)*x(n−1)+ ... +h(L−2)*x(n−(L−2))+h(L−1)*x(n−(L−1))]. A zero-insertion FIR filter according to the Disclosure is based on a defined FIR coefficient sequence in which selected coefficients in the coefficient sequence are zero-inserted, for example, each odd coefficient: h(0), [h(1)=0], h(2), [h(3)=0], ... h(L−2), [h(L−1)=0]. The FIR coefficient sequence then consists of non-zero coefficients and zero-inserted coefficients, where a non-zero coefficient is a coefficient that has not been selectively zero-inserted (even though, such non-zero coefficient can have a value of zero). A zero-insertion M-tap FIR filter according to the Disclosure is configured from an L-tap FIR filter with L coefficient multipliers, each assigned a nonzero coefficient, including reassigning a zero-inserted coefficient as a non-zero coefficient, effectively extending the length of the FIR filter by the number of zero-inserted coefficients reassigned as non-zero coefficients, so that, in the example even/odd zero-insertion coefficient sequence, the effective length is M=L*2.

For a zero-insertion FIR filter (zero-insertion mode of operation), the example even/odd zero-insertion coefficient sequence can be generalized for a zero-insertion level of P as the number of zero-inserted coefficients for each non-zero coefficient in the coefficient sequence. For example, P=1 is the even/odd case in which the odd (or even) coefficients are zero-inserted and the even (or odd) coefficients are non-zero, and P=2 is the case where two of every three coefficients in the sequence are zero-inserted, and the third coefficient is non-zero. That is, the zero-insertion coefficient sequence includes a repeating sub-sequence of a non-zero coefficients followed by one or more zero-inserted coefficients, so that for L FIR taps and coefficient multipliers, the length-extended FIR of length M can be written as: M=L*(P+1). P(0) is a normal mode of operation of an L-tap FIR filter, without zero-insertion.

An example application for the Disclosed zero-insertion FIR filter architecture is in a zero-IF TX/RX (transceiver, or transmitter or receiver), with a TX/RX IQmc corrector in the digital chain for correcting IQ mismatch in the analog chain (complex IQ modulator/demodulator). For TX with DPD, including DPD bandwidth expansion (secondary band), the zero-insertion FIR filter can be optimized for filtering IQ mismatch in the target band or created by the target band.

The zero-insertion FIR filter architecture according to the Disclosure has application where the base-band signal spectrum will have strong signals in only one part of the spectrum (center half or one sided).

In brief overview, a zero-insertion FIR filter architecture for filtering a signal with a target band and a secondary band includes digital filter circuitry that includes an L-tap FIR (finite impulse response) filter, with a number L filter tap elements (L=0, 1, 2, ... (L−1)), each with an assigned coefficient from a defined coefficient sequence. The L-tap FIR filter is configurable with a defined zero-insertion coefficient sequence of a repeating sub-sequence of a non-zero coefficient followed by one or more zero-inserted coefficients, with a number Nj of nonzero coefficients, and a number Nk of zero-inserted coefficients, so that L=Nj+Nk. The L-tap FIR filter is configurable as an M-tap FIR filter with a nonzero coefficient sequence in which each of the L filter tap elements is assigned a non-zero coefficient, the M-tap FIR filter having an effective length of M=(Nj+Nk) non-zero coefficients.

FIG. 1 illustrates an example zero-insertion FIR filter architecture 1, in transpose form, for filtering a signal with target and secondary signal bands according to the Disclosure. The example FIR filter is an L-tap FIR filter of length L taps represented by L coefficient multiplier elements [h(L)*x(n)]. The example coefficient sequence is [h(0), h(1), ... h(L−1)], each input to an assigned coefficient multiplier 3. The FIR structure includes (L−1) delay elements 5, and (L−1) MAC (multiply accumulate) elements 7.

According to aspects of the Disclosure, the example zero-insertion L-tap FIR filter 1 (with L coefficient multipliers) is configured with non-zero even coefficients, and zero-inserted odd coefficients. An example M-tap FIR filter can be configured with an effective length M that is extended by zero-insertion, with only non-zero coefficients assigned to the L coefficient multipliers, so that the effective length is M=L*2 (for the example even/odd coefficient sequence with even nonzero and odd zero-inserted coefficients).

A zero-insertion FIR filter of length L with alternate zeros can be used to model a filter optimized for essentially half of the overall band (target band). The target half band could be the center half band or left half or the right half of the band.

A zero-insertion FIR can be configured with either the even or the odd lags as non-zero. When the even lags are non-zero $$y(n) = \sum_{k=0}^{ceil(\frac{L}{2})-1} h(2k)x(n-2k)$$

Alternately, when the odd lags are non-zero, $$y(n) = \sum_{k=0}^{floor(\frac{L}{2})-1} h(2k+1)x(n-2k-1)$$

Figure 2:
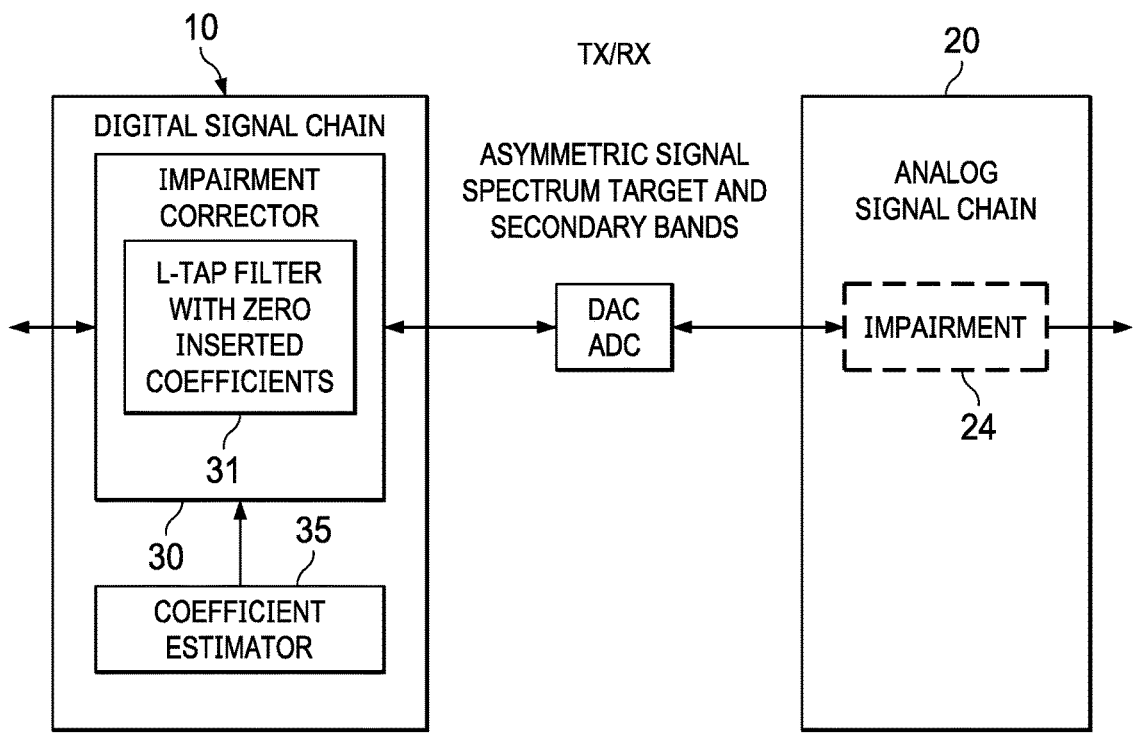
FIG. 2 illustrates an example RF TX or RX, with digital and analog signal chains 10/20, for processing a signal with target and secondary bandwidths, the analog chain introducing signal impairments 24 in both target and secondary bands, and the digital chain including an impairment corrector 30 with a zero-insertion normal L-tap FIR filter 31, that can be reconfigured, according to the Disclosure, as a zero-insertion M-tap FIR filter with zero-inserted coefficients reassigned with nonzero coefficients, effectively extending the length of the L-tap FIR to optimize for to pre/post-correcting signal impairments.

The example zero-insertion FIR is constructed with zero-inserted odd coefficients [h(2K+1)=0] for [K=0 ..., floor(L/2)−1], providing a zero-insertion M-tap filter with L even (non-zero) coefficients, for an effective length of M=2*L, that can be optimized for filtering the target band FIG. 2 illustrates an example wireless signal chain (TX or RX), with digital and analog signal chains 10/20, interfaced from a DAC/ADC (TX/RX). The signal band of interest includes a target band and a secondary (lower power) band.

The analog chain introduces signal impairments 24 in both target and secondary bands. The digital chain includes an impairment corrector 30 with a normal L-tap FIR filter 31, which can be re-configured as a zero-inserted M-tap FIR filter (such as 2 L), with zero-inserted coefficients reassigned with nonzero coefficients, effectively extending the length of the L-tap FIR, for example to optimize for pre/post-correcting the signal impairments, according to the Disclosure. The correction can be targeted to correct signal impairments created only by the target band, or alternately, to correct signal impairments created only in the target band.

Figure 3A:
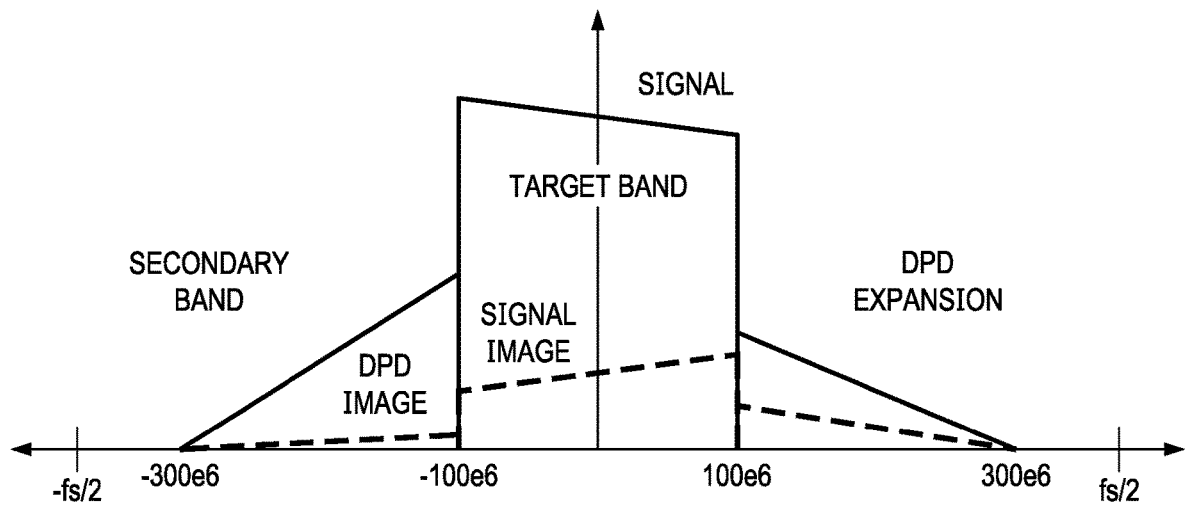
FIGS. 3A and 3B provide frequency domain waveforms for example signal spectrum, including target and secondary band(s)
Figure 3B:
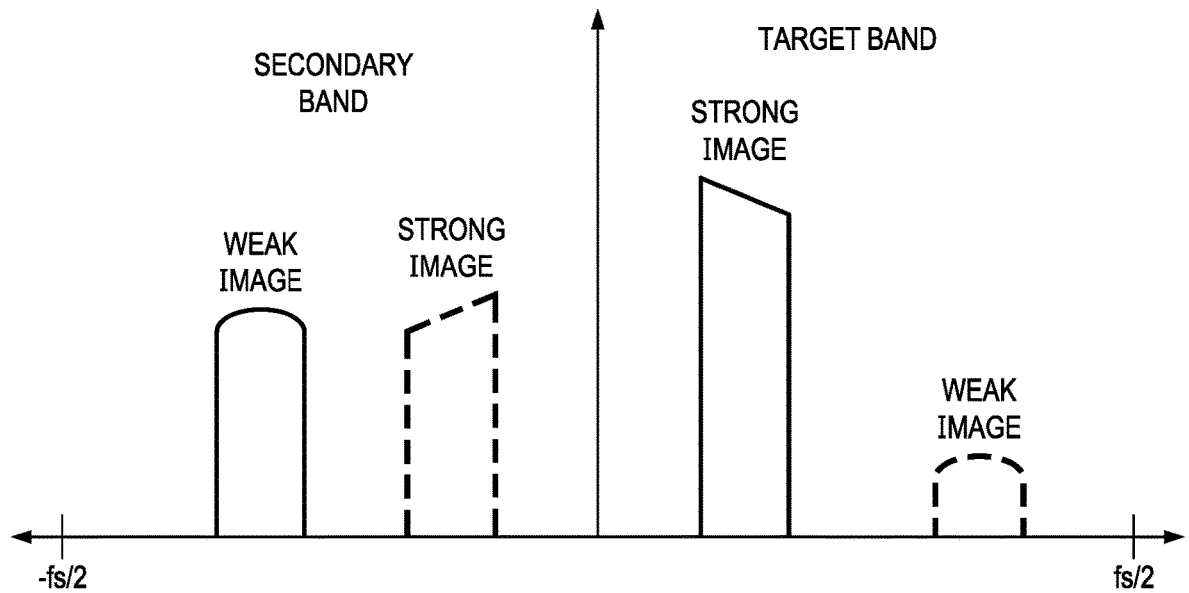

FIGS. 3A and 3B provide frequency domain waveforms for example signal spectrum, including a target band, and secondary band(s) with lower signal power. Note that zero-inserted coefficients imply that the FIR filter frequency response repeats in the secondary band, which is an incorrect filter frequency response to the secondary band. Since the signal power in secondary band is lower, this incorrect filter frequency response in secondary band does not affect overall system performance. In other scenarios the incorrect filter frequency response created by the secondary band does not affect overall system performance since signal power in secondary band is low.

Additionally circuits have a large image component which is frequency independent and this frequency independent part will be properly corrected even for the image band. The frequency dependent part would be low enough and this wrong correction of impairment created by the secondary band will not have any impact since the signal level in this band is low.

FIG. 3A illustrates a signal band with DPD bandwidth expansion. The resulting signal bandwidth includes a center (target) band, and DPD expansion (secondary) bands with lower signal power. The DPD expansion band is an example of a secondary band that would require FIR filter design with a larger number of taps to filter the wider expansion bandwidth. A 3× expansion is a commonly used configuration, requiring a FIR filter length three times longer, and running at a three times higher rate, with an overall 9× power impact due to the expansion. For example, if base-band bandwidth is 200 MHz, due to DPD 3× expansion, the TX chain would support a bandwidth of 600 MHz.

IQ mismatch signal images are superimposed on the signal (target) and DPD expansion (secondary) bands. Signal levels outside the target in-band introduced by DPD Expansion can be lower by 25 dB or more compared to the target signal. Image (secondary side band) of the DPD expansion would be further lower by 40 dB or more, and hence, can be within acceptable limits, even if architecting the FIR with zero-inserted coefficients would actually increase image created by DPD expansion bandwidth. That is, for this application, the zero-insertion FIR filter architecture according to the Disclosure uses the property of DPD expanded TX signal spectrum, and to design the TX IQmc corrector structure to correct for only the image created by the target in-band signal spectrum, leading to a lower complexity corrector filter.

FIG. 3B illustrates a right side, strong signal (target) band, and a left side, weak (lower power, secondary) signal band, both with IQ mismatch images reflected about baseband.

The zero-insertion FIR filter architecture according to the Disclosure is applicable in cases where the base-band signal spectrum has strong signals in only one part of the spectrum (center half or one sided), so that, for example, IQmc image correction can be done only for that part of the spectrum. For example, for a strong center band, [−0.8*fs/4 0.8*fs/4]. And, for strong one sided spectrum [0 0.8*fs/2]. The zero-insertion FIR filter architecture can be optimally designed for the strong signal band, leading to significant complexity reduction. Additionally, the zero-insertion FIR filter can be optimally designed for the image created by the strong signal band.

Referring to FIG. 2, a zero-insertion FIR filter according to the Disclosure can be used to model frequency dependent IQ mismatch in the center half of the overall band (target band), disregarding the DPD expansion (secondary) bands, where signal power and IQ mismatch image are lower.

Figure 4A:
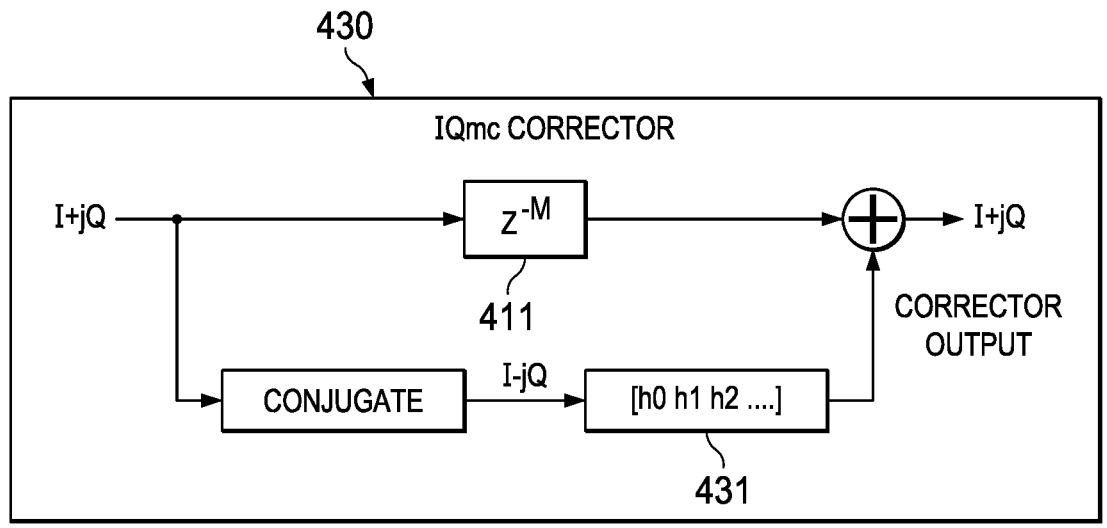
FIGS. 4A and 4B illustrate example abstracted IQmc correctors 430/530, including an I+jQ branch with group delay 411/511, and an I−jQ branch with an L-tap FIR filter 431/531.
Figure 4B:
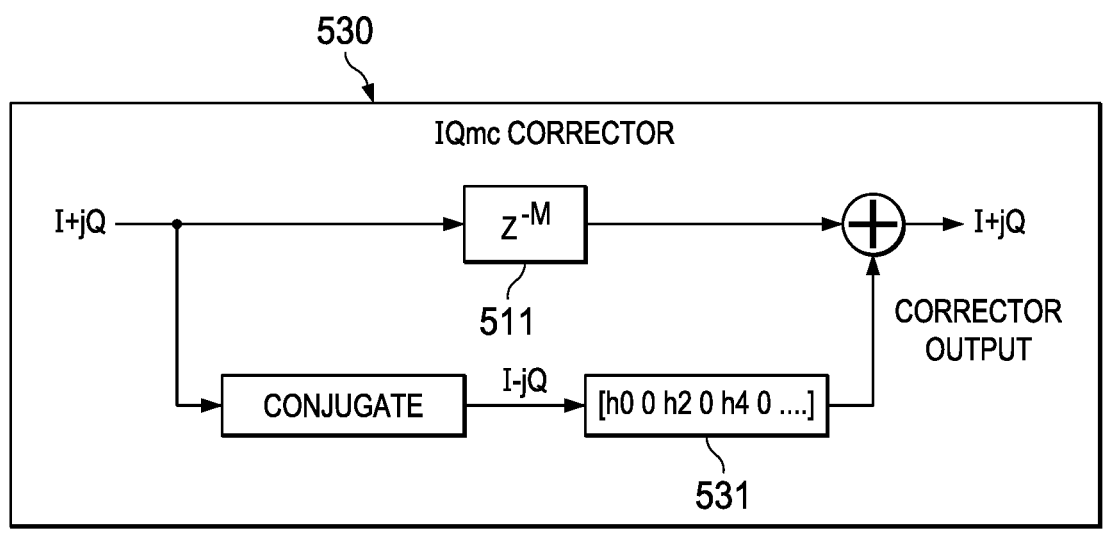

FIGS. 4A and 4B illustrate example abstracted IQmc correctors 430/530 (TX/RX). The IQmc correctors include I+jQ branches with group delays 411/511, and I-jQ branches with L-tap FIR filters 431/531.

FIG. 4A illustrates a normal mode FIR filter 431 with a normal mode coefficient sequence [h0, h1, h2 . . . ]. FIG. 4B illustrates a zero-insertion L-tap FIR filter 531 with an example zero-insertion mode coefficient sequence with zero-inserted odd coefficients [h0, 0, h2, 0, h4, 0 . . . ], which can be reconfigured as a zero-inserted M-tap FIR filter with zero-inserted coefficients reassigned with nonzero coefficients, effectively extending the length of the L-tap FIR to optimize for to pre/post-correcting signal impairments.

Figure 5A:
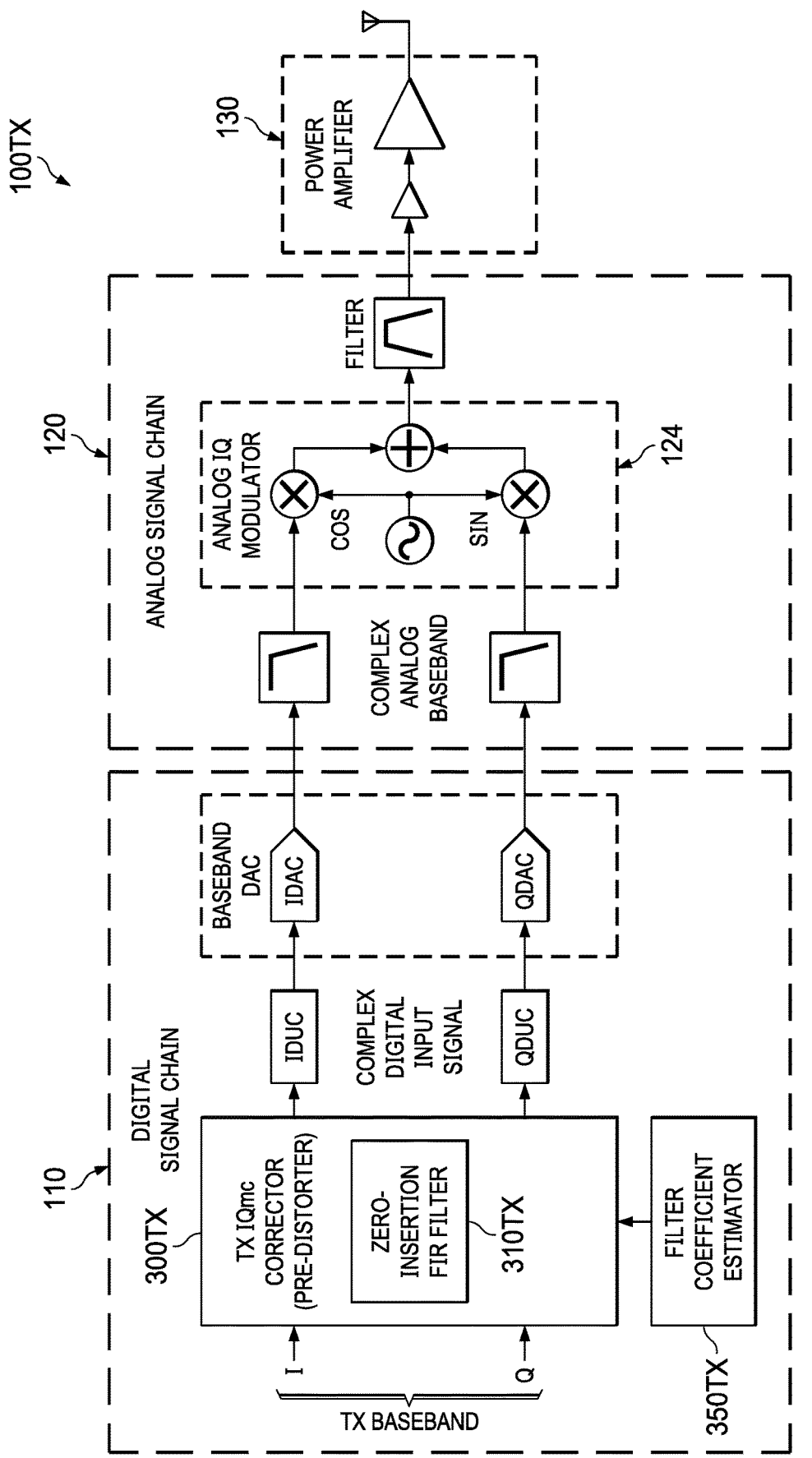
FIGS. 5A and 5B illustrate example RF TX and RX zero IF architectures 100TX and 200RX, including analog and digital signal chains, the TX chain including a digital TX/RX IQmc corrector 300TX/300RX, with zero-insertion L-tap FIR filters 310TX/310RX to correct for analog-chain signal impairments, according to the Disclosure.
Figure 5B:
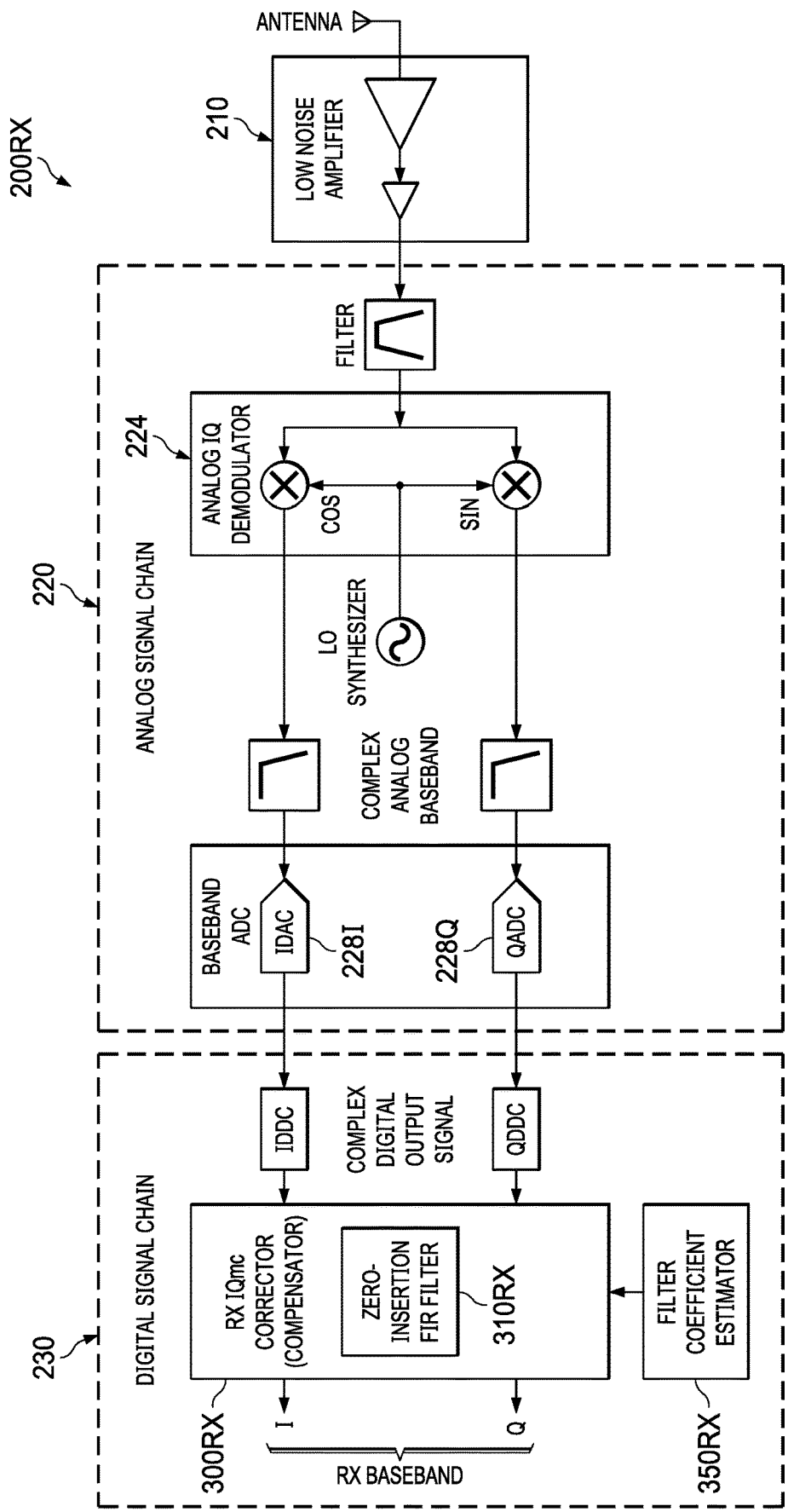

FIGS. 5A and 5B illustrate example RF TX and RX zero IF (intermediate frequency) architectures 100TX and 200RX, including analog and digital signal chains. The TX chains include a digital TX/RX IQmc corrector 300TX/300RX, with zero-insertion L-tap FIR filters 310TX/310RX to compensate for analog-chain signal impairments, according to the Disclosure.

FIG. 5A illustrates an example RF TX zero IF architecture with a TX chain 110, analog chain 120, and power amplifier 130. The TX chain includes a TX IQmc Corrector 300TX with a zero-insertion FIR filter 310TX to compensate (pre-compensate) for downstream analog IQ mismatch errors introduced by the analog IQ modulator 124, FIG. 5B illustrates an example RF RX zero IF architecture with an LNA receiver 210, analog chain 220, and RX chain 230. The RX chain includes an RX IQmc corrector 300RX with a zero-insertion FIR filter 310RX to correct for upstream analog IQ mismatch errors introduced by the analog IQ demodulator 224.

The filter coefficients representing IQ mismatch can be estimated 350TX/350RX using off-line or on-line methods (for example, based on image rejection ratio).

Figure 6A:
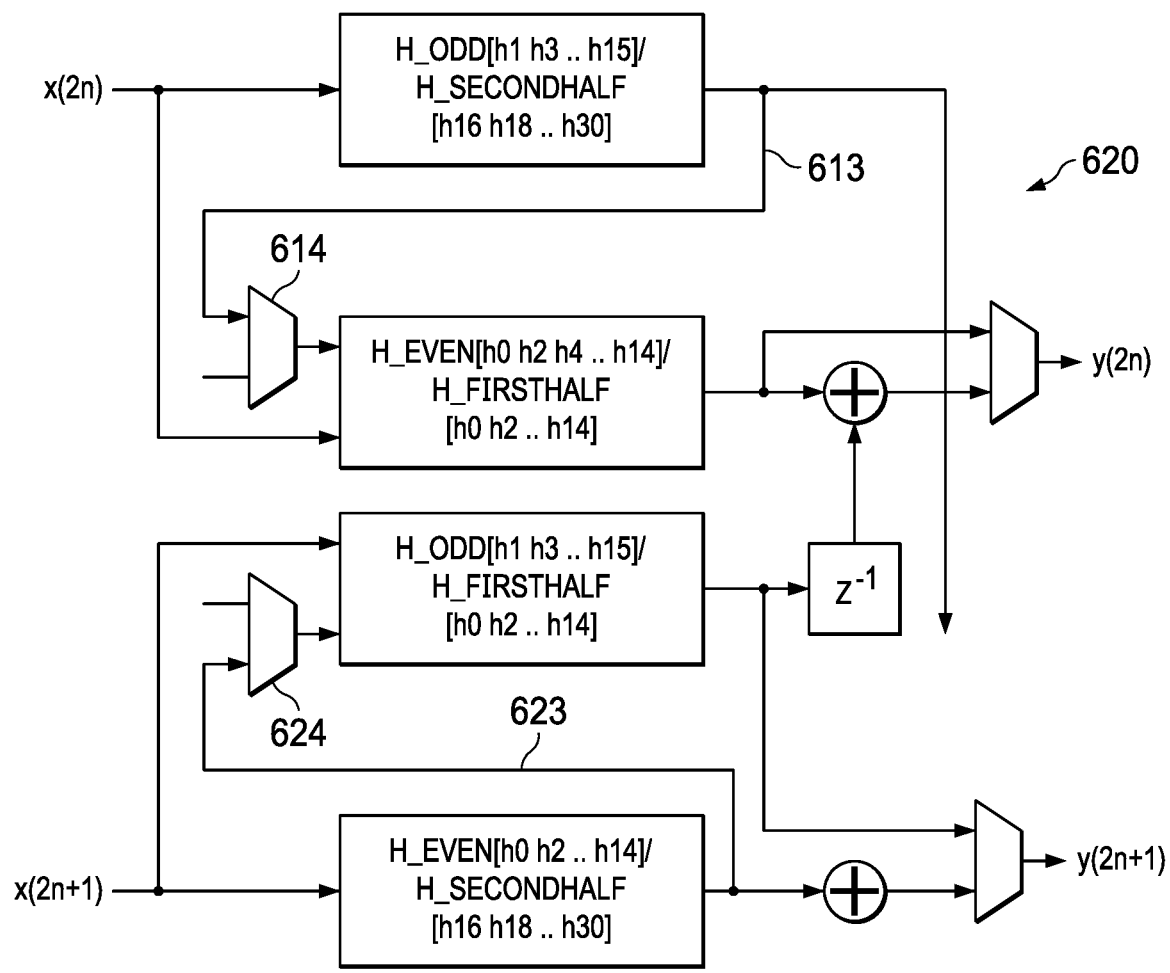
FIGS. 6A and 6B illustrate an example 2× parallelization FIR filter architecture, with an example FIR filter structure configurable to operate either in normal mode as an L tap FIR, or in zero-insertion mode as a zero-insertion, length-extended M=2 L tap FIR.
Figures 6B, 7:
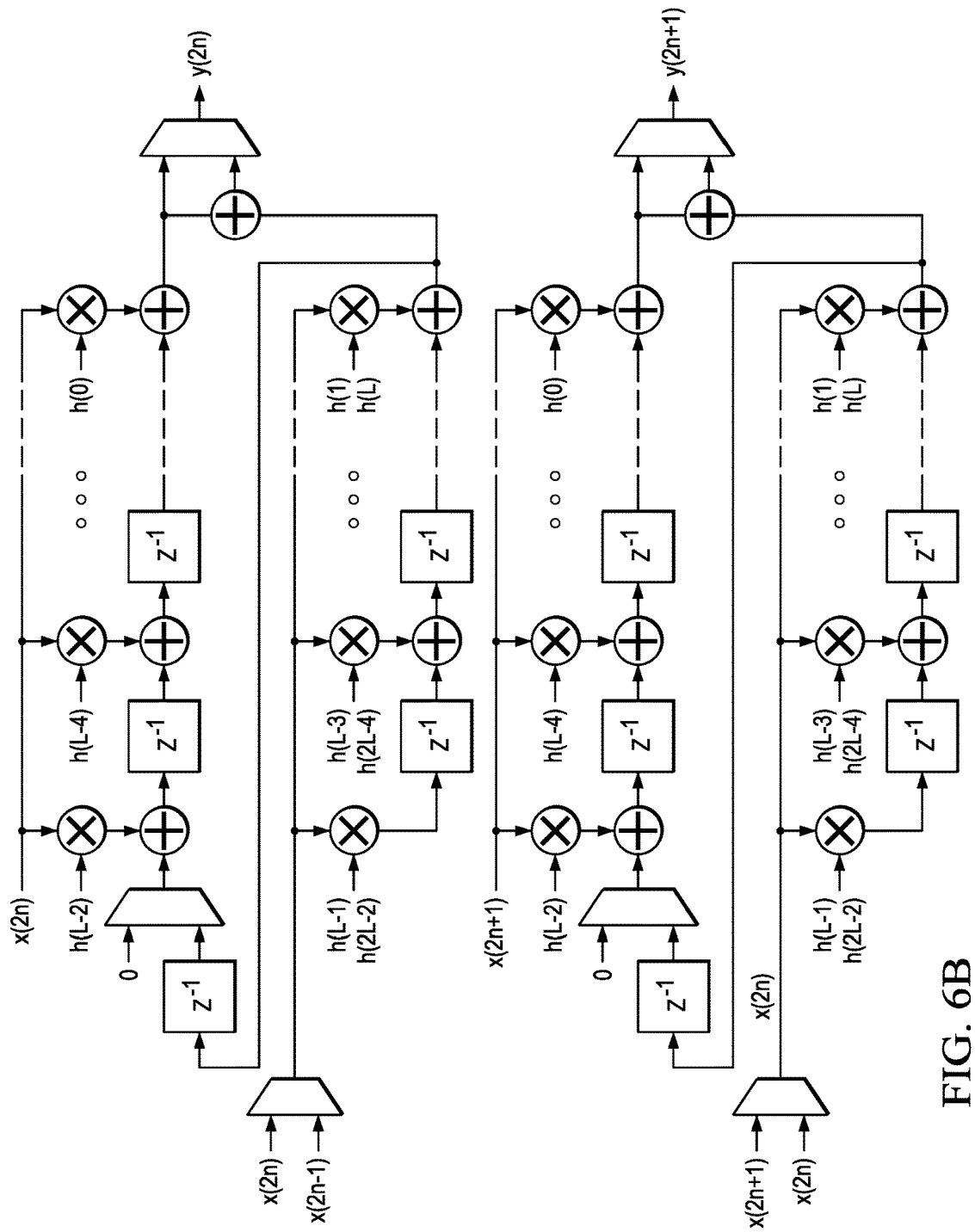
FIG. 7 illustrates an example RF 4T4R2FB transceiver TX/RX 700, including TX analog channels A-D (720TX), with IQ modulators (724TX), and RX analog channels A-D (720RX), with IQ demodulators (724RX), and including a TX/RX/FB digital block (750) configured with TX and RX digital IQmc correctors according to the Disclosure.
Figure 7A:
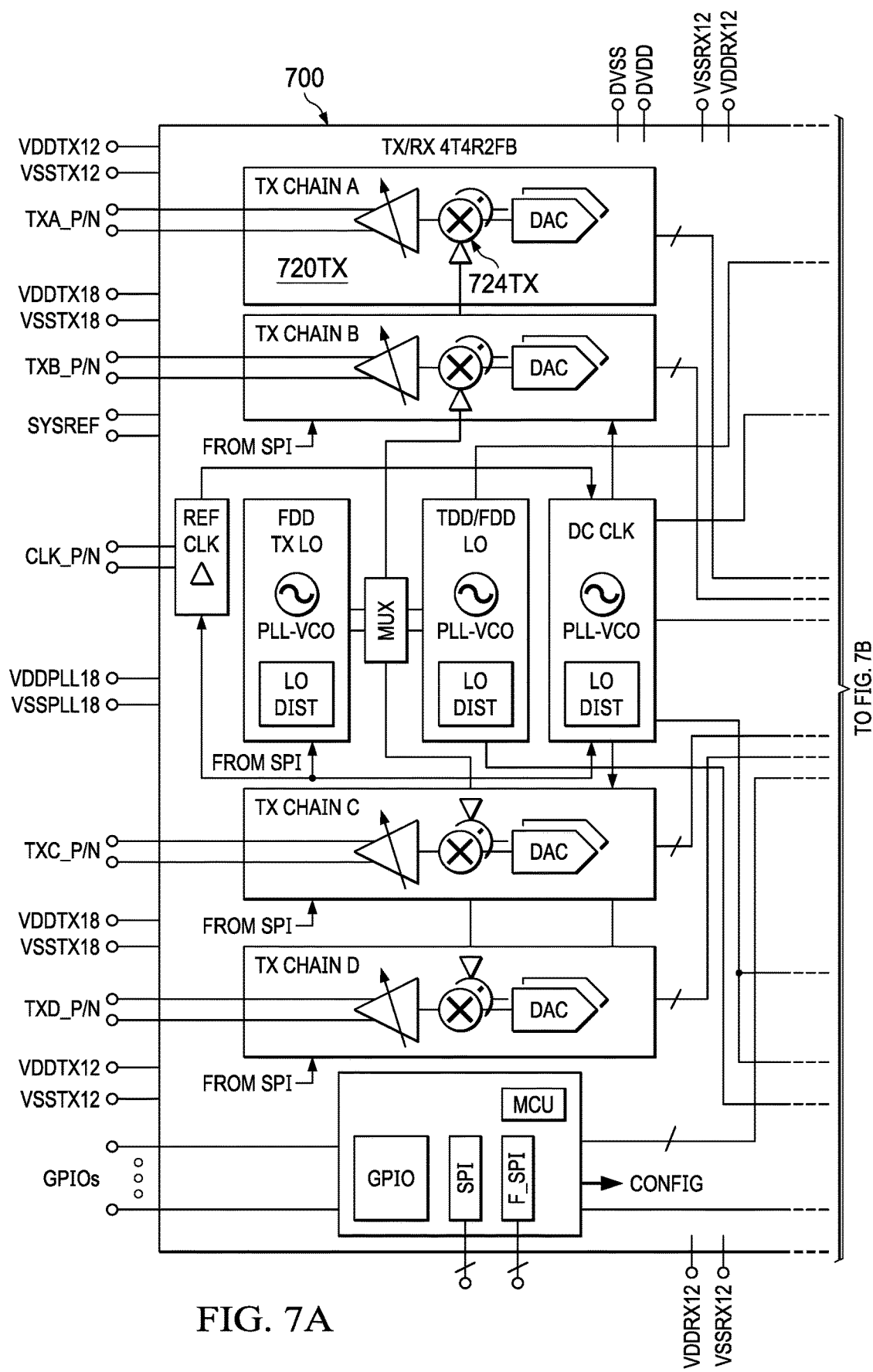
Figure 7B:
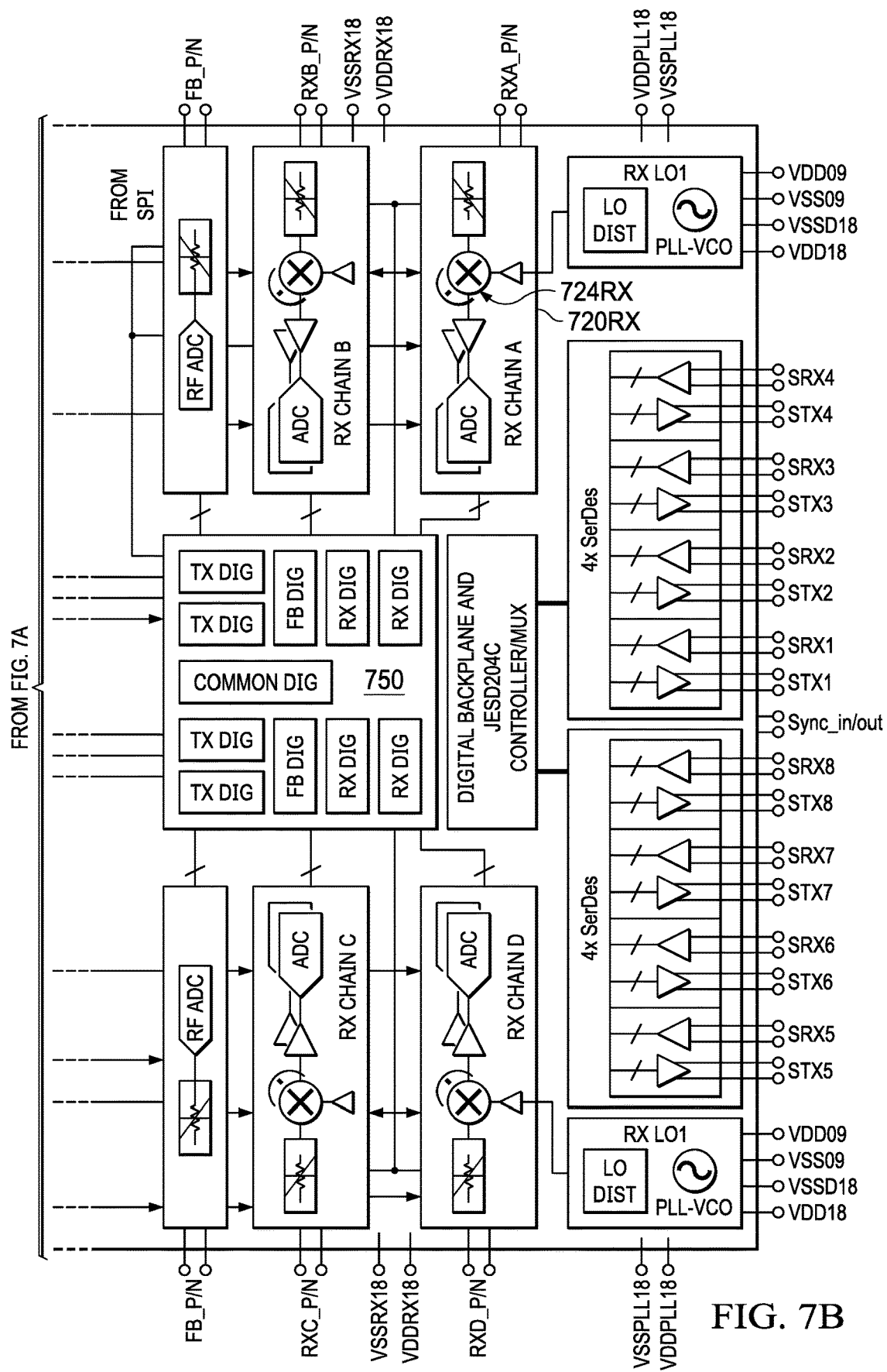

FIGS. 6A and 6B illustrate an example 2× parallelization FIR filter architecture for normal and zero-insertion coefficient modes. The 2× paralleled implementation of a real filter includes Even and Odd FIR filter sections used for a full filter, that can be repurposed for a zero-insertion operating mode of the FIR filter by rerouting the filter outputs from the end sections as input to the middle sections and coefficient reordering. For example, a normal 16 tap filter can be repurposed as a 32 tap FIR filter, with 16 zero-inserted coefficients and filter elements appropriately reassigned as coefficients within a 32 coefficient sequence.

FIG. 6A illustrates an example abstracted dual mode zero-insertion FIR filter architecture 620, configurable in normal and zero insertion modes. The FIR filter architecture 620 can be configured with parallel x(2n) and x(2n+1) filters.

Each FIR includes filter sections EVEN [h0, h2, . . . h14] and ODD [h1, h3, . . . h15] in normal mode. In zero insertion mode, each filter is configurable with 32 filter taps including 16 configurable filter tap coefficients and 16 zero-inserted coefficients. [h0, h2, . . . h14] can be used as is and filter elements used as ODD [h1, h3, . . . h15] in normal mode are reassigned as [h16, h18, . . . h30] in zero-inserted mode.

Each filter is operable in zero-insertion mode, with the corresponding filter sections with reassigned (zero-inserted) filter tap elements, rerouted 613/614 and 623/624 to form the M(32)=2 L filter taps.

FIG. 6B illustrates the example 2× parallelization FIR filter structure in transpose form. The zero-insertion FIR filter supports both normal mode and zero inserted mode by repurposing the odd and even filter sections from a 2× parallelized implementation for realizing a longer zero inserted filter. Filter output from one section is input to the other section to effectively make it a longer filter.

FIG. 7 illustrates and example RF 4T4R2FB transceiver TX/RX 700. TX/RX 700 includes TX analog channels A-D 720TX, and RX analog channels A-D 720RX. A TX/RX/FB digital block 750 includes TX and RX digital IQmc correctors according to the Disclosure.

The Disclosure provided by this Description and the Figures sets forth example designs and applications illustrating aspects and features of the invention, and does not limit the scope of the invention, which is defined by the claims. Known circuits, connections, functions and operations are not described in detail to avoid obscuring the principles and features of the Disclosed example designs and applications. This Disclosure can be used by ordinarily skilled artisans as a basis for modifications, substitutions and alternatives, including adaptations for other applications.

The invention claimed is:

1. A circuit including a digital filter for filtering a signal with a target band and a secondary band, comprising:
   an interface coupled to receive an input digital signal with a signal bandwidth that includes the target band and the secondary band wherein the secondary band has a signal power that is lower than a signal power of the target band; and
   digital filter circuitry coupled to the interface, the digital filter circuitry including:
      an L-tap FIR (finite impulse response) filter, with a number L filter tap elements (L=0, 1, 2, . . . (L−1)), each with an assigned coefficient from a defined coefficient sequence;
      the L-tap FIR filter configurable with a defined zero-insertion coefficient sequence of a repeating sub-sequence of a nonzero coefficient followed by one or more zero-inserted coefficients, with a number Nj of non-zero coefficients, and a number Nk of zero-inserted coefficients, so that L=Nj+Nk; and
      the L-tap FIR filter configurable as an M-tap FIR filter with a non-zero coefficient sequence in which each of the L filter tap elements is assigned non-zero coefficient, the M-tap FIR filter having an effective length of M=2 L nonzero coefficients.

2. The circuit of claim 1, wherein the nonzero coefficient sequence is selected for filtering the signal in the target band.

3. The circuit of claim 1, wherein L is an even number, and the L-tap FIR filter is configured with Nj=L/2 coefficients in a sequence [0, 2, 4, ... (L−2)], and Nk=L/2 coefficients in a K sequence [1, 3, 5, ... (L−1)] assigned as zero-inserted coefficients.

4. The circuit of claim 1,
wherein the digital filter circuitry is configured to filter signal impairments in the target band, where a defined signal impairment power level is between the signal power levels of the target band and the secondary band; and
wherein the M-tap FIR filter is configured:
to attenuate the signal impairments created by the target band to a power level that is below the defined signal impairment power level; and
to increase signal impairments created by the secondary band to a power level that is also below the defined impairment power level.

5. The circuit of claim 1, wherein the selectively assigned coefficients are generated by one of off-line estimation, or on-line estimation.

6. A circuit for use in a system for radio frequency (RF) communication of an RF signal including a target frequency band, the system including a transmit (TX) end, and receive (RX) end, the circuit, comprising:
an interface coupled to receive a signal with a signal bandwidth that includes the target band and a secondary band, the secondary band having a signal power that is lower than a signal power of the target band;
at one of the TX end and the RX end, an analog signal chain and a digital signal chain, the analog signal chain to operate on an analog signal based on the signal, and the digital signal chain to operate on a digital signal based on the signal:
the analog signal chain including analog circuitry that introduces analog signal impairments to the analog signal within the target band and the secondary band, the signal impairments being frequency dependent,
the digital signal chain including corrector circuitry to filter the digital signal to correct the analog signal impairments, and to generate a filtered digital signal, and
an interface between the digital signal chain and the analog signal chain; and the corrector circuitry, including:
an L-tap FIR (finite impulse response) filter, with a number L filter tap elements (L=0, 1, 2, ... (L−1)), each with an assigned coefficient from a defined coefficient sequence;
the L-tap FIR filter configurable with a defined zero-insertion coefficient sequence of a repeating sub-sequence of a nonzero coefficient followed by one or more zero-inserted coefficients, with a number Nj of nonzero coefficients, and a number Nk of zero-inserted coefficients, so that L=Nj+Nk; and
the L-tap FIR filter configurable as an M-tap FIR filter with a nonzero coefficient sequence in which each of the L filter tap elements is assigned a non-zero coefficient, the M-tap FIR filter having an effective length of M=2 L nonzero coefficients.

7. The circuit of claim 6, wherein L is an even number, and the L-tap FIR filter is configured with Nj=L/2 coefficients in a sequence [0, 2, 4, ... (L−2)], and Nk=L/2 coefficients in a K sequence [1, 3, 5, ... (L−1)] assigned as zero-inserted coefficients.

8. The circuit of claim 6, further comprising a defined analog signal impairment power level that is between the signal power levels of the target band and the secondary band, and wherein the L-tap FIR filter is configurable with the selectively assigned coefficients:
to attenuate the analog signal impairments created by the analog signal target band to a power level that is below the defined signal impairment power level; and
to increase signal impairments created by the analog signal secondary band to a power level that is also below the defined impairment power level.

9. The circuit of claim 6, wherein
the analog and digital signal chains each include I and Q signal paths; and
the analog signal impairments are analog I and Q mismatch impairments in the analog I and Q signal paths, manifested in the frequency domain as signal images.

10. The circuit of claim 6, wherein:
at the TX end, the corrector circuitry to pre-compensate the digital signal to correct the analog signal impairments introduced in a downstream analog signal chain; and
at the RX end, the corrector circuitry to compensate the digital signal to correct the analog signal impairments introduced in an upstream analog signal chain.

11. The circuit of claim 6, wherein the circuit is at the TX end, and wherein:
the digital signal chain includes the corrector circuitry; and
associated digital pre-distortion (DPD) expansion bands are secondary bands.

12. The circuit of claim 6, wherein the interface circuitry comprises:
at the TX end, a digital to analog converter; and
at the RX end, an analog to digital converter.

13. A method of digital filtering a signal with a target band and a secondary band, comprising:
configuring an L-tap FIR (finite impulse response) filter, with a number L filter tap elements (L=0, 1, 2, ... (L−1)), each with an assigned coefficient from a defined coefficient sequence;
configuring the L-tap FIR filter with a defined zero-insertion coefficient sequence of a repeating sub-sequence of a nonzero coefficient followed by one or more zero-inserted coefficients, with a number Nj of nonzero coefficients, and a number Nk of zero-inserted coefficients, so that L=Nj+Nk; and
configuring the L-tap FIR filter as an M-tap FIR filter with a nonzero coefficient sequence in which each of the L filter tap elements is assigned non-zero coefficient, the M-tap FIR filter having an effective length of M=2 L nonzero coefficients;
wherein the secondary band has a signal power that is lower than a signal power of the target band.

14. The method of claim 13, wherein the nonzero coefficient sequence is selected for filtering the signal in the target band.

15. The circuit of claim 13, wherein L is an even number, and the L-tap FIR filter is configured with Nj=L/2 coefficients in a sequence [0, 2, 4, ... (L−2)], and Nk=L/2 coefficients in a K sequence [1, 3, 5, ... (L−1)] assigned as zero-inserted coefficients.

16. The method of claim 13,
signal impairments are filtered in the target band, where a defined signal impairment power level is between the signal power levels of the target band and the secondary band; and wherein the M-tap FIR filter is configured:
- to attenuate the signal impairments created by the target band to a power level that is below the defined signal impairment power level; and
- to increase signal impairments created by the secondary band to a power level that is also below the defined impairment power level.

17. The circuit of claim 13, wherein the selectively assigned coefficients are generated by one of off-line estimation, or on-line estimation.

* * * * *